(12) United States Patent
Ohta

(10) Patent No.: US 7,497,117 B2
(45) Date of Patent: Mar. 3, 2009

(54) ANGULAR VELOCITY MOUNT ARRANGEMENT

(75) Inventor: Tameharu Ohta, Takahama (JP)

(73) Assignee: DENSO CORPORATION, Kariya (JP)

( * ) Notice: Subject to any disclaimer, the term of this patent is extended or adjusted under 35 U.S.C. 154(b) by 169 days.

(21) Appl. No.: 11/511,237

(22) Filed: Aug. 29, 2006

(65) Prior Publication Data
US 2007/0044558 A1 Mar. 1, 2007

(30) Foreign Application Priority Data
Aug. 30, 2005 (JP) .............................. 2005-249710

(51) Int. Cl.
*G01P 1/02* (2006.01)
*G01P 9/04* (2006.01)
(52) U.S. Cl. ..................... 73/493; 73/504.12
(58) Field of Classification Search ............... 73/493, 73/431, 866.5, 504.12
See application file for complete search history.

(56) References Cited

U.S. PATENT DOCUMENTS

| | | | |
|---|---|---|---|
| 4,898,031 A | | 2/1990 | Oikawa et al. |
| 5,866,818 A | * | 2/1999 | Sumi et al. ............... 73/514.33 |
| 6,009,751 A | | 1/2000 | Ljung |
| 6,021,670 A | | 2/2000 | Takeuchi |
| 6,035,712 A | * | 3/2000 | Ohta et al. .................. 73/493 |
| 6,182,508 B1 | | 2/2001 | Takeuchi et al. |
| 6,316,840 B1 | | 11/2001 | Otani |
| 6,613,829 B2 | * | 9/2003 | Fukuizumi et al. .......... 524/439 |
| 6,769,319 B2 | * | 8/2004 | McDonald et al. .......... 73/866.1 |
| 6,880,399 B1 | | 4/2005 | Okoshi et al. |
| 6,963,134 B2 | | 11/2005 | Otani |
| 7,057,331 B2 | * | 6/2006 | Shimodaira et al. ......... 310/344 |
| 7,218,036 B2 | * | 5/2007 | Shimodaira et al. ......... 310/340 |
| 7,249,509 B2 | * | 7/2007 | Hirano ...................... 73/504.12 |

FOREIGN PATENT DOCUMENTS

| DE | 103 40 938 A1 | 3/2005 |
|---|---|---|
| EP | 1 489 379 A2 | 12/2004 |

OTHER PUBLICATIONS

Office Action dated May 5, 2008 in corresponding German Patent Application No. 10 2006 040 564.1 (and English translation).

* cited by examiner

*Primary Examiner*—Helen C. Kwok
(74) *Attorney, Agent, or Firm*—Posz Law Group, PLC

(57) ABSTRACT

An angular velocity mount arrangement includes an angular velocity sensor and a mount member. The angular velocity sensor includes an oscillator, an angular velocity sensing element, a package, and a plurality of lead frames. The angular velocity sensing element senses an angular velocity based on an oscillation of the oscillator in a first axis direction. The mount member is arranged relative to the angular velocity sensor in a second axis direction, which is generally orthogonal to the first axis direction. The angular velocity sensor is mounted to the mount member through the plurality of lead frames. At least one extending segment is a middle segment of each of the plurality of lead frames and extends toward the mount member in the second axis direction. The at least one extending segment of each of the plurality of lead frames is able to oscillate in the first axis direction.

14 Claims, 6 Drawing Sheets

ANGULAR VELOCITY MOUNT ARRANGEMENT

CROSS REFERENCE TO RELATED APPLICATION

This application is based on and incorporates herein by reference Japanese Patent Application No. 2005-249710 filed on Aug. 30, 2005.

BACKGROUND OF THE INVENTION

1. Field of the Invention

The present invention relates to a mount structure and mount method for mounting an angular velocity sensor by use of lead frames.

2. Description of Related Art

Conventionally, this type of angular velocity sensor includes a package and an angular velocity sensing element, which includes an oscillator and is received in the package. Here, the angular velocity sensing element detects an angular velocity based on a detection vibration of the oscillator. The angular velocity sensor includes lead frames, which electrically connect with an exterior.

Conventionally, for example, Japanese Unexamined Patent Publication 2003-46479 corresponding to U.S. Pat. No. 6,880,399 discloses a mount structure, in which the above angular velocity sensor is coupled with a mount member through the lead frames. In this publication, the mount member is disposed such that the mount member surrounds an outer periphery of the package. Also, an outer peripheral end portion of the package is electrically connected with the mount member, which is located around the outer peripheral end portion, through the lead frames.

An oscillation angular velocity sensor detects the angular velocity by vibrating the oscillator and then sensing a displacement (i.e., a detected oscillation) of the oscillator due to a Coriolis force when the angular velocity is applied. The detected oscillation is normally a high-frequency oscillation, and the angular velocity is detected based on the above high-frequency oscillation.

Thus, an erroneous detection may occur in a case where a high-frequency external oscillation, which oscillates in an oscillation direction of the above detected oscillation, reaches the oscillator through the mount member and overlaps the detected oscillation. Therefore, it is needed that the high-frequency external oscillation, which oscillates in the oscillation direction of the detected oscillation, is reduced by a vibration control.

In case of a structure, where the angular velocity sensor is coupled with the mount member through the lead frames, the external oscillation that reaches the angular velocity sensor can be controlled when the high-frequency external oscillation is reduced by use of the lead frames. In order to attain this, it may be needed that the lead frames are longer and that a rigidity of the lead frames is reduced such that a resonance frequency in a spring-mass system, in which the lead frame serves as a spring and the angular velocity sensor serves as a mass, is reduced.

However, in the above conventional art, in a case where the lead frames are elongated to control the vibration, the lead frames greatly extend radially from the outer periphery of the package of the angular velocity sensor. Thus, a mount space for mounting the angular velocity sensor to the mount member disadvantageously becomes larger. As a result, the mount member becomes larger and the structure becomes larger.

SUMMARY OF THE INVENTION

The present invention is made in view of the above disadvantages. Thus, it is an objective of the present invention to address at least one of the above disadvantages.

To achieve the objective of the present invention, there is provided an angular velocity mount arrangement, which includes an angular velocity sensor and a mount member. The angular velocity sensor includes an oscillator, an angular velocity sensing element, a package, and a plurality of lead frames. The angular velocity sensing element senses an angular velocity based on an oscillation of the oscillator in a first axis direction. The package houses the angular velocity sensing element. Each of the plurality of lead frames is electrically connected to the angular velocity sensing element. The mount member is arranged relative to the angular velocity sensor in a second axis direction, which is generally orthogonal to the first axis direction. The angular velocity sensor is mounted to the mount member through the plurality of lead frames. Each of the plurality of lead frames includes a first end segment, at least one extending segment, and a second end segment. The first end segment is fixed to the package. The at least one extending segment is a middle segment of each of the plurality of lead frames and extends toward the mount member in the second axis direction. The second end segment is fixed to the mount member. The at least one extending segment of each of the plurality of lead frames is able to oscillate in the first axis direction.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF PREFERRED EMBODIMENTS

First Embodiment

A first embodiment of the present invention will be described with reference to accompanying drawings. An angular velocity sensor 100 is mounted on, for example, a vehicle to detect an angular velocity, which is applied to the vehicle.

Figure 1:
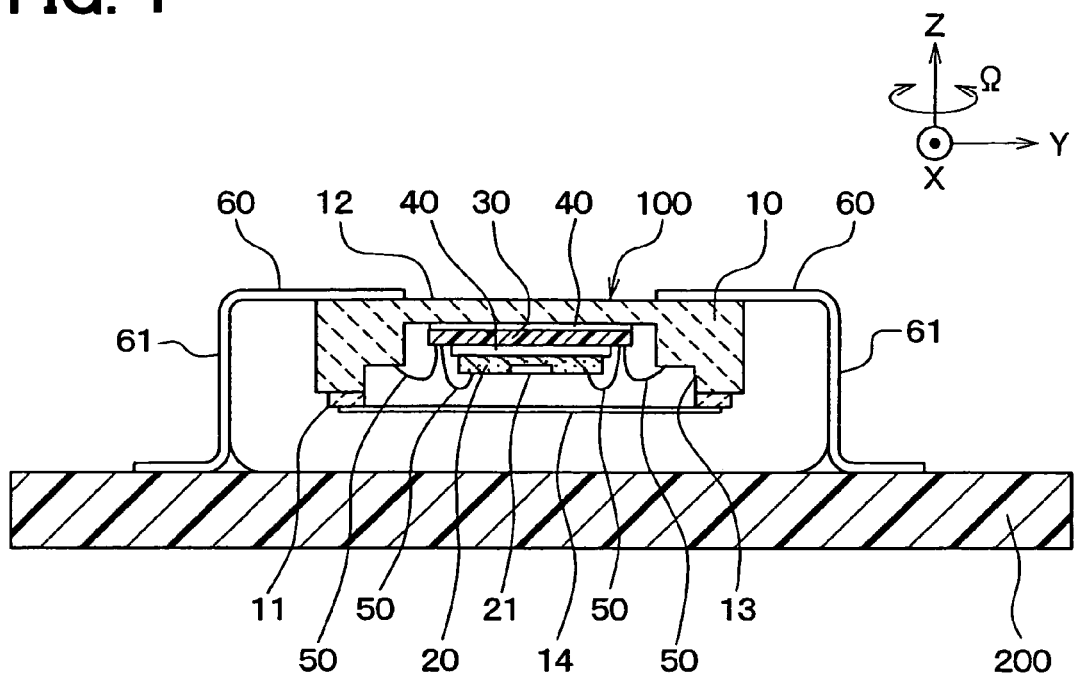
FIG. 1 is a schematic sectional view of a mount structure of mounting an angular velocity sensor according to a first embodiment of the present invention.

As shown in FIG. 1, the angular velocity sensor 100 generally includes a package 10 and lead frames 60. A circuit substrate 30 and an angular velocity sensing element 20 are mounted inside the package 10 through adhesives 40, and are electrically connected with each other through bonding wires 50. Also, the lead frames 60 are electrically connected with the angular velocity sensing element 20.

The package 10 houses the circuit substrate 30 and the angular velocity sensing element 20, and serves as a base part that forms a main body of the angular velocity sensor 100. Specifically, the package 10 has an opening portion 13 on a first face 11 side of the package 10, and the circuit substrate 30 and the angular velocity sensing element 20 are received in the opening portion 13.

Also, the angular velocity sensor 100 is mounted on a mount member 200 in a state where the first face 11 of the package 10 faces the mount member 200 and a second face 12 of the package 10 is located on an opposite side of the package 10, which is opposite from the mount member 200.

The package 10 is structured as a multilayer substrate, which includes multiple ceramic layers, such as alumina ceramics, though this structure is not shown. Wirings are formed at a surface of each ceramic layer and also inside through holes formed at each of ceramic layers.

Figure 3A:
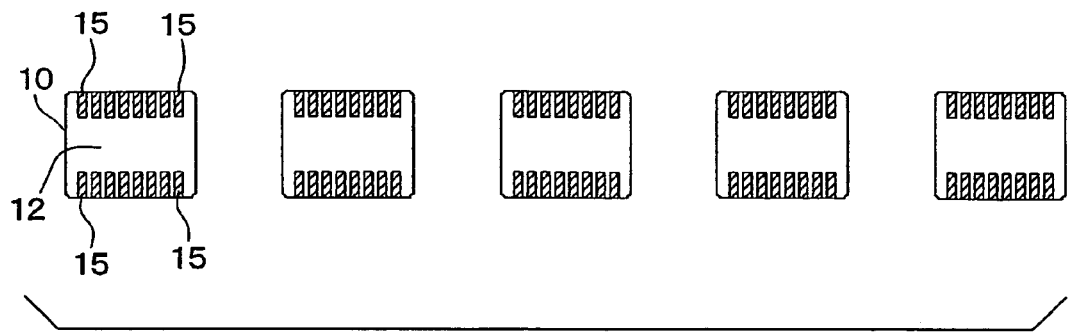
FIG. 3A is a schematic plan view of multiple angular velocity sensors showing a manufacturing step thereof by use of multiple lead frame arrangement.

Each of the above wirings of the package 10 comes out at the opening portion 13 and the second face 12 of the package 10 such that the one end of the wiring, which comes out at the opening portion 13, is connected with the bonding wire 50 and another end of the wiring, which comes out at the second face 12 of the package 10, is electrically and mechanically connected with a first end segment of each lead frame though a solder. Each of the wirings, which come out at the second face 12 constitute each of pads 15 as shown in FIG. 3A, which will be described later.

Here, the lead frame 60 and the another end of the wiring, which comes out at the second face 12 of the package 10, are brazed through a silver filler material, which includes an alloy of silver and copper, or a high-temperature solder, a melting point of which is more than 300° C.

In the angular velocity sensor 100, the angular velocity sensing element 20 and the circuit substrate 30 are electrically connected with the lead frames 60 through the wirings of the package 10 and the bonding wires 50.

The package 10 includes a lid 14, which is mounted on the opening portion 13 through a welding or a brazing, such that the lid 14 seals the opening portion 13 of the package 10. Here, the lid 14 is made of, for example, a metal, a resin or a ceramics.

The circuit substrate 30 is fixed on a bottom surface of the opening portion 13 of the package 10 through the adhesive, and then the angular velocity sensing element 20 is fixed on the circuit substrate 30 through the adhesive 40. A general adhesive can serve as the adhesive 40. For example, a resin adhesive (e.g., a silicone gel) or an adhesive film (e.g., a silicone adhesive film, an epoxy adhesive film, a polyimide adhesive film) is used.

The angular velocity sensing element 20 is constituted as a semiconductor chip, which includes an oscillator 21, similarly to a general oscillation angular velocity sensing element. The above angular velocity sensing element 20 is formed by performing a known micromachining to a semiconductor substrate, such as a silicon on insulator (SOI) substrate.

Specifically, the oscillator 21 of the angular velocity sensing element 20 may be formed as a beam structure having a comb shape as generally known. The oscillator 21 is operable in relation to an applied angular velocity because the oscillator 21 is supported by the beam that is resilient.

In FIG. 1, an angular velocity $\Omega$ of a rotational movement about a Z axis is applied to the oscillator 21 while the oscillator 21 oscillates in an X axis direction. In this case, due to a Coriolis force the oscillator 21 oscillates in a Y axis direction (first axis direction), which is orthogonal to the X axis. In other words, this oscillation is defined as a detected oscillation of the oscillator 21 in a detected oscillation direction. A Z axis direction corresponds to a second axis direction of the present invention.

The angular velocity sensing element 20 includes a detection electrode, which is not shown. The angular velocity $\Omega$ can be detected by sensing a change of capacitance between the oscillator 21 and the detection electrode the change being caused by the detected oscillation of the oscillator 21.

As above, the angular velocity sensing element 20 detects the angular velocity $\Omega$ based on the detected oscillation of the oscillator 21 (e.g., based on the detected oscillation in the Y axis direction in the present embodiment). A frequency of the detected oscillation is not determined based on, for example, the structure of the oscillator. However, in this type of the oscillation angular velocity sensor 100, the frequency is normally, for example, about a few thousands Hz.

The circuit substrate 30 is structured as a signal processing chip, which sends drive signals and detection signals to the angular velocity sensing element 20. Also, the signal processing chip processes electrical signals supplied from the angular velocity sensing element 20 and outputs the signals to an exterior.

The above circuit substrate 30 includes an IC chip, which has, for example a MOS transistor or a bipolar transistor formed on a silicone substrate through a known semiconductor process.

As shown in FIG. 1, the angular velocity sensing element 20 and the circuit substrate 30 are electrically connected by the bonding wires 50. Also, the circuit substrate 30 and the above-described wirings of the package 10 are electrically connected by the bonding wires 50. Here, the bonding wires 50 are made of gold or aluminum. Thus, the bonding wires 50 provide electrical connection among each of components, such as the angular velocity sensing element 20, the circuit substrate 30 and the package 10.

Thus, the electrical signals supplied from the angular velocity sensing element 20 are transmitted to the circuit substrate 30. Then, the electrical signals are converted into voltage signals by use of, for example, a C/V conversion circuit that is provided to the circuit substrate 30 such that the voltage signals are transmitted as angular velocity signals.

Then, the above angular velocity signals are outputted externally through the lead frames 60 because the angular velocity sensing element 20 and the circuit substrate 30 are electrically connected with the lead frames 60 through the wirings of the package 10 and the bonding wires 50 as discussed above.

The present angular velocity sensor 100 is mounted on the mount member 200 and is electrically and mechanically connected with the mount member 200 through the lead frames 60. The first end segment of each lead frame 60 is fixed to and electrically connected with the package 10. Also, the second end segment of the lead frame is fixed to and electrically connected with the mount member 200 through the solder.

The mount member 200 may be a wiring board (e.g., a printed circuit board, a ceramic substrate) or a connector member. The printed circuit board serves as the mount member 200 in the present embodiment. The angular velocity signals from the angular velocity sensor 100 are outputted to the mount member 200, which is the printed circuit board, through the lead frames 60.

In the present angular velocity sensor 100, each lead frame 60 is a general lead frame made of an electrical conductive material, such as copper or 42 alloy. Also, multiple lead frames 60 are provided to the angular velocity sensor 100. Each lead frame 60 is formed by bending a narrow plate.

A segment of the lead frame 60 between the first end segment and the second end segment (i.e., a middle segment of the lead frame 60) serves as an extending segment 61, which extends toward the mount member 200 in a mount direction (second axis direction) of the angular velocity sensor 100. Here, the angular velocity sensor 100 and the mount member 200 are overlapped and arranged relative to each other in the mount direction.

Because of a resilient characteristic of the extending segment 61, the extending segment 61 is able to oscillate in an orthogonal direction to an extending direction of the extending segment 61. The extending segment 61 oscillates in the detected oscillation direction of the oscillator 21 (i.e., the Y axis direction). Thus, the extending segment 61 can substantially oscillate in a similar direction to that of the detected oscillation of the oscillator 21.

In the present embodiment, each lead frame 60 is set longer to reduce a resonance frequency in a spring-mass system, in which the lead frames 60 serve as a spring and the angular velocity sensor 100 serves as a mass.

Therefore, even in a case where a high-frequency external oscillation along the Y axis, which indicates an oscillation direction of the above detected oscillation, reaches the mount member 200, the external oscillation is decayed because of the oscillation of the extending segment 61. Thus, the external oscillation does not overlap with the detected oscillation of the oscillator 21 such that a vibration control of the oscillator 21 against the external oscillation is attained.

Figure 2:
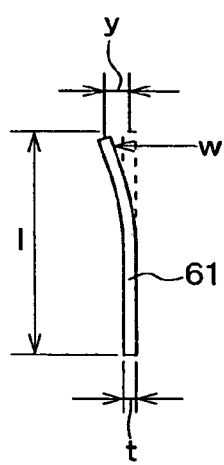
FIG. 2 is a diagram of an extending segment showing an oscillation model, in which the extending segment oscillates in a detected oscillation direction.

The vibration control by use of the extending segment 61 will be described with reference to a typical model. FIG. 2 is a diagram of the extending segment 61 showing an oscillation model, in which the extending segment oscillates in the detected oscillation direction. There are depicted that a length of the extending segment 61 as l, a width as b, a board thickness as t, a deflection amount due to the oscillation thereof as y, and a force applied thereto as w. Here, the width b is a width size of the extending segment 61 in a perpendicular direction to a drawing surface of FIG. 2, though the width b is not shown in FIG. 2.

In the present embodiment, the vibration control is attained in the spring-mass system, in which the extending segments 61 of the lead frames 60 serve as the spring and the angular velocity sensor 100 serves as the mass. A resonance frequency $\omega_0$ of the spring-mass system is expressed as the following equation 1, wherein the number of the extending segments 61 (i.e., the number of the lead frames 60) is depicted as n, a spring constant of each extending segment 61 as k, a mass of the angular velocity sensor 100 as m.

$$\omega_0 = [(n \cdot k)/m]^{1/2} \quad \text{(equation 1)}$$

Here, the spring constant $k=w/y$, and therefore, the spring constant k is expressed as the following equation 2 by use of the above-described sizes b, l, t of the extending segment 61 and Young's modulus E of the extending segment 61.

$$k = w/y = Ebt^3/4l^3 \quad \text{(equation 2)}$$

It is known from the above equations 1, 2 that the resonance frequency $\omega_0$ becomes reduced when the length l of the extending segment 61 is elongated.

Thus, the length l of the extending segment 61 can be determined such that a desired resonance frequency $\omega_0$ can be attained by use of relationship of the equations 1, 2. Here the above model and the equations can be derived from a general spring-mass system theory.

In the present embodiment, as shown in FIG. 1, the extending segment 61 is formed by bending a part of the first end segment of the lead frame 60 toward the mount member 200, the part being close to the middle segment. That is, the extending segment 61 is formed by bending a connection between the first end segment and the middle segment of the lead frame 60 toward the mount member 200.

Then, the first end segment of the lead frame 60 is fixed to the second face 12 of the second face 12 on the side of the package 10 opposite from the first face 11, which faces the mount member 200. The extending segment 61 extends along an edge face of the package 10.

Next, a mount method for mounting the mount structure of the angular velocity sensor of the present embodiment will be described with reference to FIGS. 3, 4.

Figure 3B:
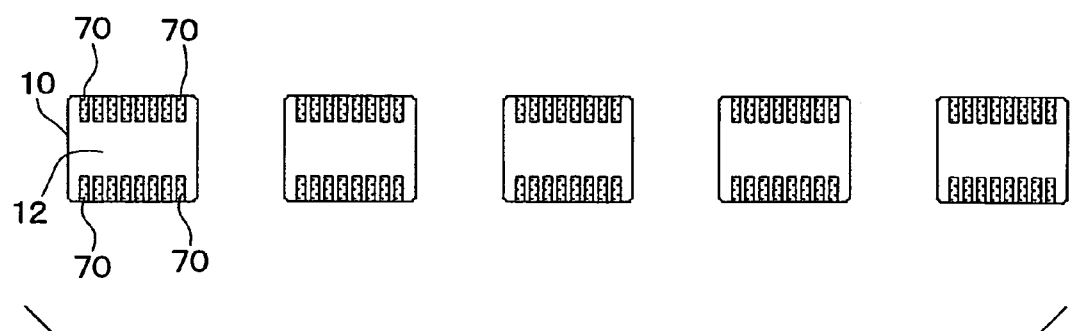
FIG. 3B is a schematic plan view of the multiple angular velocity sensors showing another manufacturing step thereof by use of the multiple lead frame arrangement.
Figure 3C:
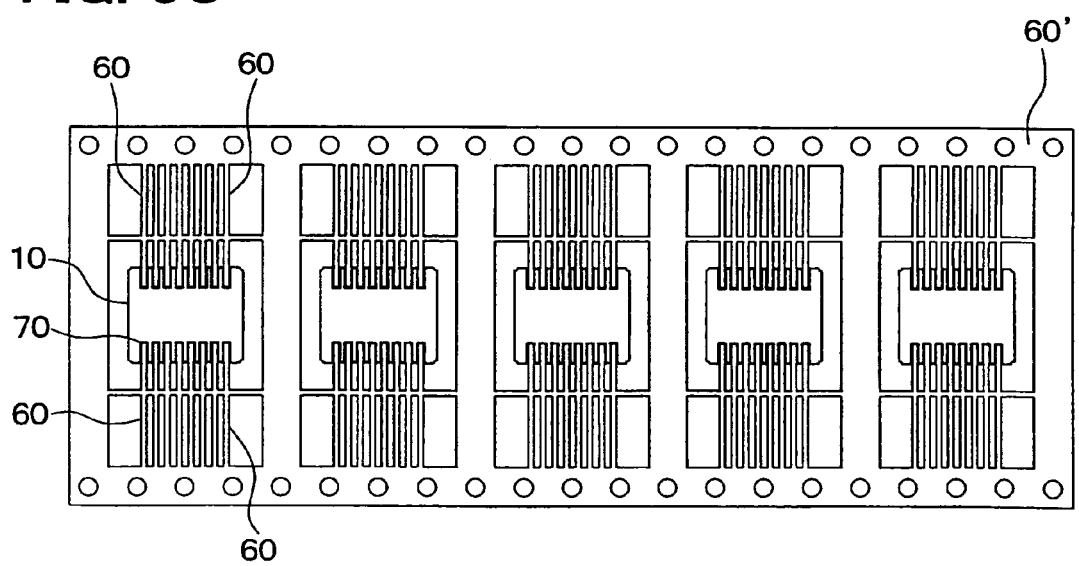
FIG. 3C is a schematic plan view of the multiple angular velocity sensors showing another manufacturing step thereof by use of the multiple lead frame arrangement.
Figure 4A:
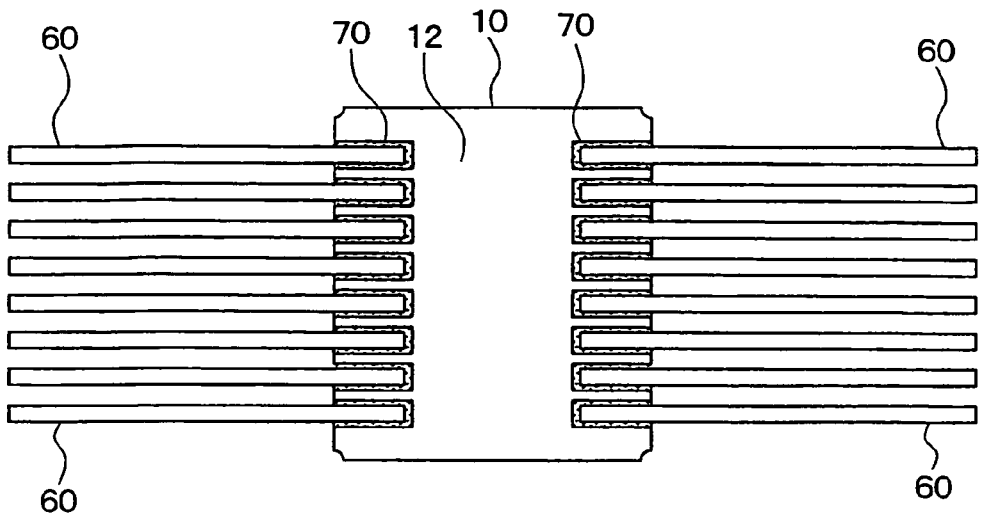
FIG. 4A is a schematic plan view of the angular velocity sensor after the lead frames are cut.
Figure 4B:
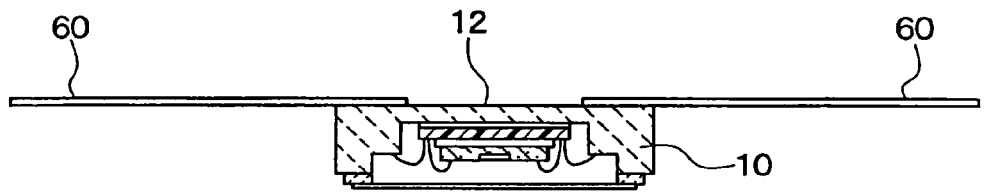
FIG. 4B is a schematic side view of the angular velocity sensor shown in FIG. 4A.

FIGS. 3A to 3C are schematic plan views of the angular velocity sensors 100 showing a manufacturing process of the multiple angular velocity sensors 100 by use of a multiple lead frame arrangement 60'. FIGS. 4A to 4D are schematic diagrams of the angular velocity sensor 100 showing a forming process of the lead frames 60 after a cut process (i.e., after each angular velocity sensor 100 has been detached from the multiple lead frame arrangement 60'). Here, in FIG. 4B is a schematic sectional view of the angular velocity sensor 100 shown in FIG. 4A. The FIG. 4D is a schematic sectional view of the angular velocity sensor 100 shown in FIG. 4C.

Firstly, the circuit substrate 30 and the angular velocity sensing element 20 are mounted inside the opening portion 13 of the package 10 through the adhesives 40. Also, each component is connected with each other through the bonding wires 50. Then, the above-described lid 14 is mounted to the package 10.

Then, the multiple packages 10 as described above are prepared as shown in FIG. 3A. The pad 15 is formed at a corresponding section on the second face 12 of each package 10, the section being to be connected with the first end segment of each lead frame 60. The pad 15 is an exposed portion of the above wiring of the package 10.

Then, as shown in FIG. 3B, a solder 70 is supplied to each pad 15 on the package 10 through a print or a dispense.

The solder 70 used here preferably has a higher melting point than that of another solder, which is used in a later step for mounting the angular velocity sensor 100 to the mount member 200. This is because the higher melting point of the solder 70 may limit a fear of remelting of the solder 70 in the later step. Here, considering a process requirement, a common solder may be used in the later step and the step shown in FIG. 3B.

Then, as shown in FIG. 3C, the multiple lead frame arrangement 60' is prepared such that the each lead frame 60 is temporarily fixed to the corresponding solder 70. In this state, the solder 70 is reflow soldered. Thus, the lead frame 60 and the pad 15 of the package 10 are connected through the solder 70.

Then, tie bars of the multiple lead frame arrangement 60' are cut so that the lead frames 60 for each angular velocity sensor 100 are detached. This state is shown in FIGS. 4A, 4B.

Figure 4C:
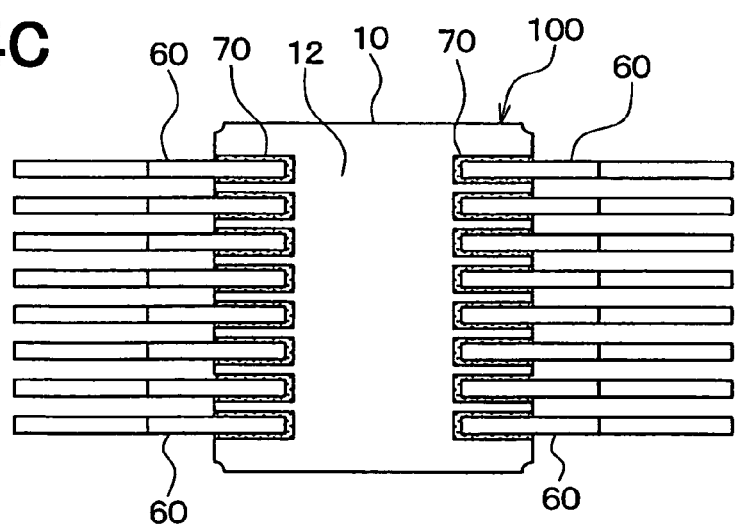
FIG. 4C is a schematic plan view of the angular velocity sensor after a forming step is performed.
Figure 4D:
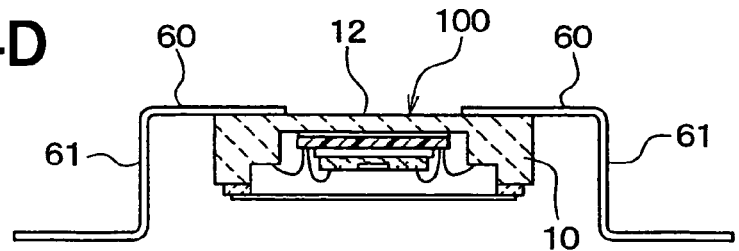
FIG. 4D is a schematic side view of the angular velocity sensor shown in FIG. 4C.

Then, a forming process of the lead frames 60 is made as shown in FIGS. 4C, 4D such that a part of each lead frame is formed into the extending segment 61 as shown in FIG. 1. In this way, the angular velocity sensor 100 is completed.

The angular velocity sensor 100 is mounted on the mount member 200 as shown in FIG. 1 through the solder such that the angular velocity sensor 100 is connected with the mount member 200 through the lead frames 60.

In the present embodiment, the angular velocity sensor 100 is mounted on the mount member 200, and each lead frame 60 includes the first end segment, the middle segment and the second end segment. The first end segment is fixed to the package 10, the middle segment serves as the extending segment 61, which extends toward the mount member 200 along the mount direction, and the second end segment is fixed to the mount member 200.

Because of the resilient characteristic of the extending segment 61, the extending segment 61 is able to oscillate in the orthogonal direction to the extending direction of the extending segment 61. Also, the extending segment 61 oscillates in the detected oscillation direction of the oscillator 21. Thus, the vibration control of the oscillator 21 is achieved against the external oscillation.

Thus, in the present embodiment, a mount area needed to mount the angular velocity sensor 100 on the mount member 200 is not changed even when the extending segments 61 are elongated to reduce the resonance frequency for the above vibration control. That is, in the present embodiment, the lead frames 60 can be elongated for the vibration control with limited enlargement or without enlargement of the mount space (area) of the angular velocity sensor 100 to the mount member 200.

Also, in the present embodiment, the first end segment of each lead frame 60 is fixed to the second face 12 of the package 10, and the extending segment 61 extends along the edge face of the package 10. Therefore, even when the extending segment 61 is elongated, a height of the structure in the mount direction can be set shorter by a thickness of the package 10 between the first face 11 and the second face 12 than a height thereof otherwise (i.e., when the extending segment 61 is elongated, the height of the structure in the mount direction is cancelled out by the thickness of the package 10 so that the height of the structure can be kept lower).

Also, in the present embodiment, the angular velocity sensing element 20 includes the oscillator 21 on one side of the angular velocity sensing element 20, which faces the mount member 200. In a normal mount structure of an angular velocity sensor, the mount member is located at a lower side relative to the angular velocity sensor. Therefore, when an object attaches to the oscillator 21, the object is easily detached from the oscillator 21 by gravity. As a result, a sensing performance can be maintained good.

Second Embodiment

Figure 5:
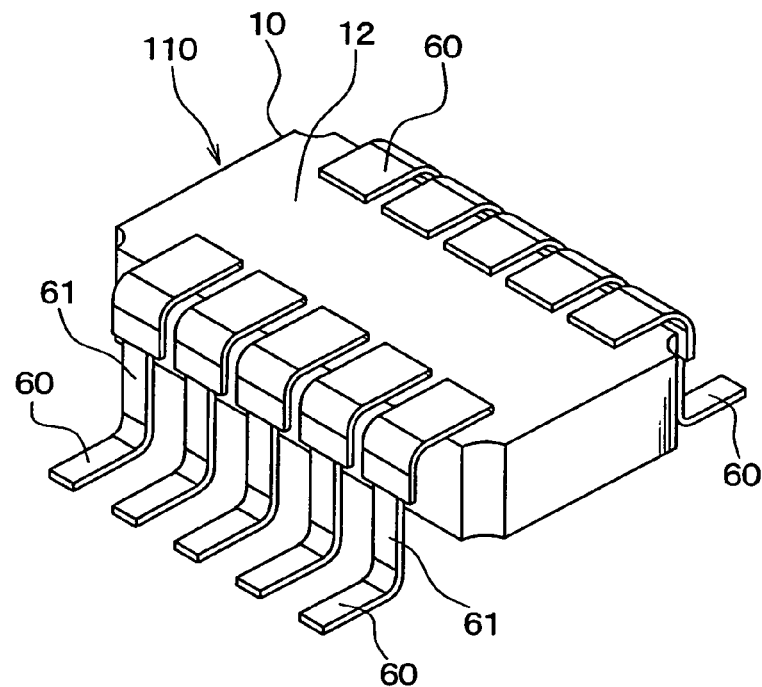
FIG. 5 is a perspective view of an angular velocity sensor according to a second embodiment of the present invention.

FIG. 5 is a perspective view of an angular velocity sensor 110 according to a second embodiment of the present invention. Similar components of the angular velocity sensor 110 of the present embodiment similar to the components of the angular velocity sensor 100 of the first embodiment are indicated by the same numerals. In the angular velocity sensor 110 of the present embodiment, the extending segment 61 is thinner (narrower) than the first end segment of each lead frame 60. That is, in FIG. 5, a portion on the first end segment side of the lead frame 60 is thicker (wider) than the extending segment 61.

Also in the present embodiment, similarly to the mount structure of the first embodiment, the angular velocity sensor 110 is mounted on a mount member, which is not shown, and is fixed to the mount member through the second end segment of each lead frame 60.

In the lead frames 60 of the present embodiment, a rigidity of a relatively narrow segment of each lead frame 60 is lower than that of a relatively wider segment, and therefore, the relatively narrow segment is apt to be deformed. Thus, when the lead frames 60 of the present embodiment are applied, the extending segment 61 of the lead frame 60 serves as a more readily deformable portion, which oscillate to control the vibration, compared to the first end segment.

Third Embodiment

Figure 6:
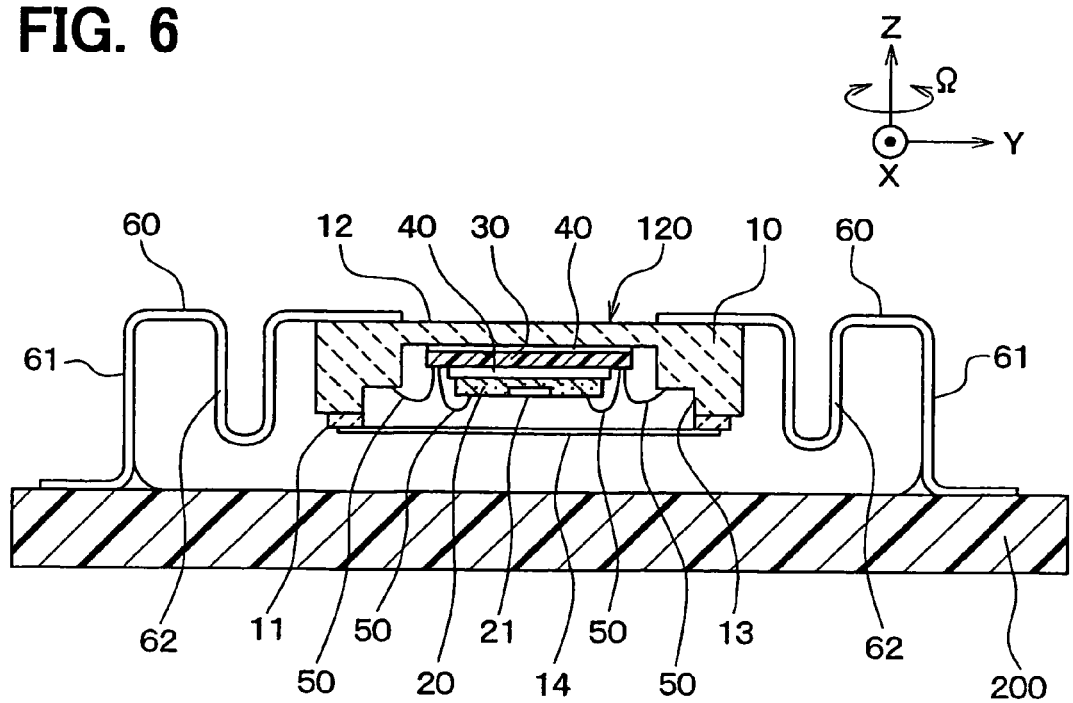
FIG. 6 is a schematic sectional view of a mount structure of mounting an angular velocity sensor according to a third embodiment of the present invention.

FIG. 6 is a schematic sectional view of a mount structure of mounting an angular velocity sensor 120 to the mount member 200 according to a third embodiment of the present invention. Similar components of the angular velocity sensor 120 of the present embodiment similar to the components of the angular velocity sensor 100 in the first embodiment are indicated by the same numerals. In the angular velocity sensor 120 of the present embodiment, a part of the lead frames 60 of the first embodiment is changed.

As shown in FIG. 6, a connection segment of the lead frame 60 between the first end segment and the extending segment 61 is bent and is formed into a bent shape having a segment (second extending segment) 62, which extends in an identical direction as the extending segment 61. Here, the lead frame 60 is bent into a U shape.

Because of the spring characteristic, the segment 62 can oscillate in the similar direction as the oscillation direction of the extending segment 61. In other words, the segment 62, which extends in the same direction as the extending segment 61, can oscillate similarly to the extending segment 61, and can serve as another extending segment. Also, the segment 62 can assist the oscillation of the extending segment 61.

Fourth Embodiment

Figure 7:
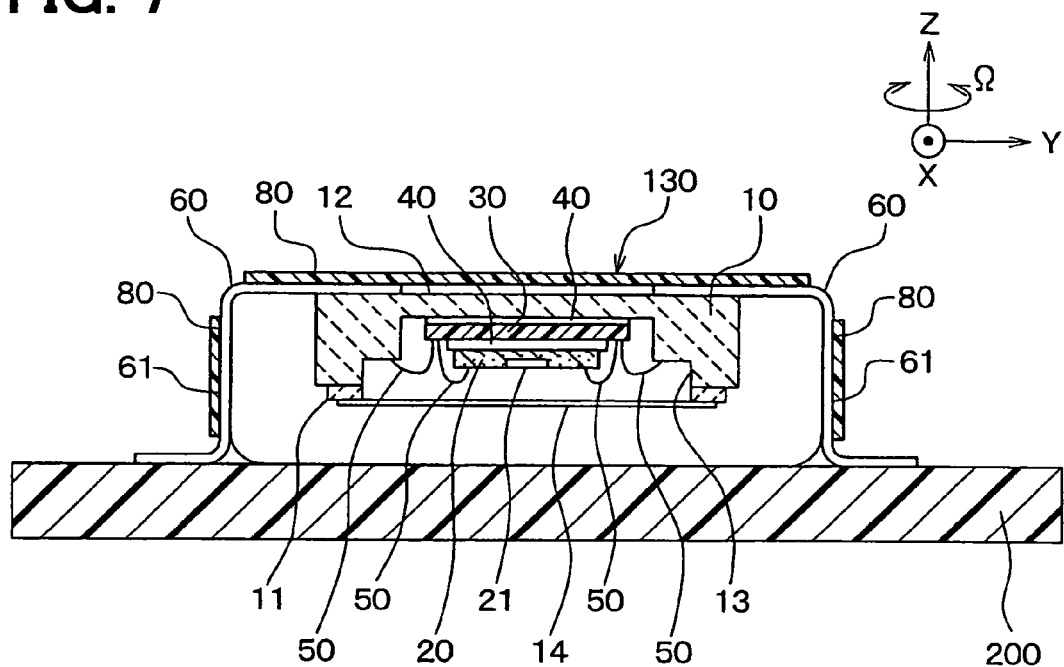
FIG. 7 is a schematic sectional view of a mount structure of mounting an angular velocity sensor according to a fourth embodiment of the present invention.

FIG. 7 is a schematic sectional view of a mount structure of mounting an angular velocity sensor 130 to the mount member 200 according to a fourth embodiment of the present invention.

Similar components of the angular velocity sensor 130 of the present embodiment similar to the components of the angular velocity sensor 100 in the first embodiment are indicated by the same numerals. As shown in FIG. 7, the angular velocity sensor 130 of the present embodiment includes adhesive members 80, each of which is adhesive and attached to a segment of each lead frame 60 between the first end segment and the second end segment. Both the first and second end segments serve as fixing members. The adhesive member 80 can be made of a resilient material.

For example, the adhesive member 80 includes a rubber film or sheet, which is attachable to the lead frame 60, and also includes a silicone rubber resin, which is applied to the lead frame 60. In the present embodiment, the adhesive member 80 is a sheet-shaped silicone rubber, which is easy to handle.

Because of the adhesive characteristic of the adhesive member 80, the adhesive member 80 can maintain a low quality factor (Q factor) of the oscillation caused by the spring characteristic when the adhesive member 80 is applied to an oscillation part of the lead frame 60. That is, the adhesive member 80 can reduce an oscillation width of the lead frame 60 caused by the resonance frequency. Therefore, influence of the oscillation of the lead frames 60 upon the angular velocity sensor 130 can be reduced.

Here, in the present embodiment, the adhesive member 80 is attached to a part of the first end segment of the lead frame 60, the part being oscillating, in order to limit the Q value of the oscillation due to the spring characteristic of the lead frame 60.

Fifth Embodiment

Figure 8:
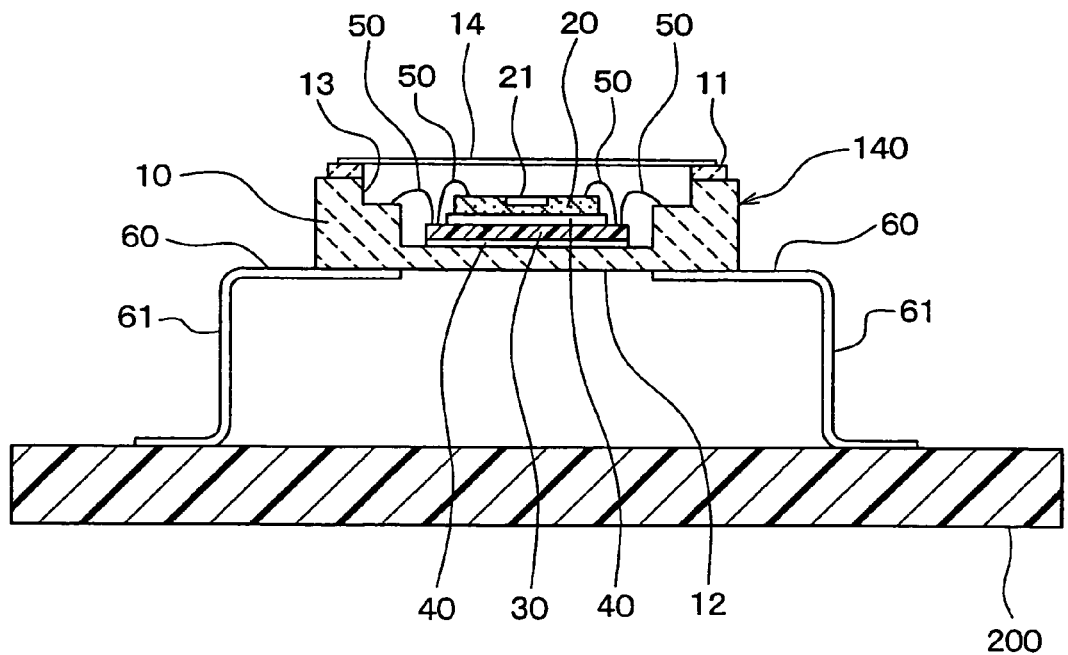
FIG. 8 is a schematic sectional view of a mount structure of mounting an angular velocity sensor according to a fifth embodiment of the present invention.

FIG. 8 is a schematic sectional view of a mount structure of mounting an angular velocity sensor 140 to the mount member 200 according to a fifth embodiment of the present invention.

Similar components of the angular velocity sensor 140 of the present embodiment similar to the components of the angular velocity sensor 100 in the first embodiment are indicated by the same numerals. In each of the above embodiment, the first end segment of the lead frame 60 is fixed to the second face 12 of the package 10. Also, the extending segment 61 extends along the edge face of the package 10.

In contrast to the above embodiments, in the present embodiment, as shown in FIG. 8, the second face 12 of the package 10 faces the mount member 200. The first end segment of the lead frame 60 is fixed to the second face 12.

In this case, the mount area for mounting the angular velocity sensor 140 on the mount member 200 is not changed when the extending segment 61 is elongated, although a height of the mount structure in the mount direction is slightly larger than the height of those in the above embodiments. That is, in the present embodiment, the lead frames 60 can be elongated for the vibration control with limited enlargement of or without enlargement of the mount space of the angular velocity sensor.

Sixth Embodiment

Figure 9:
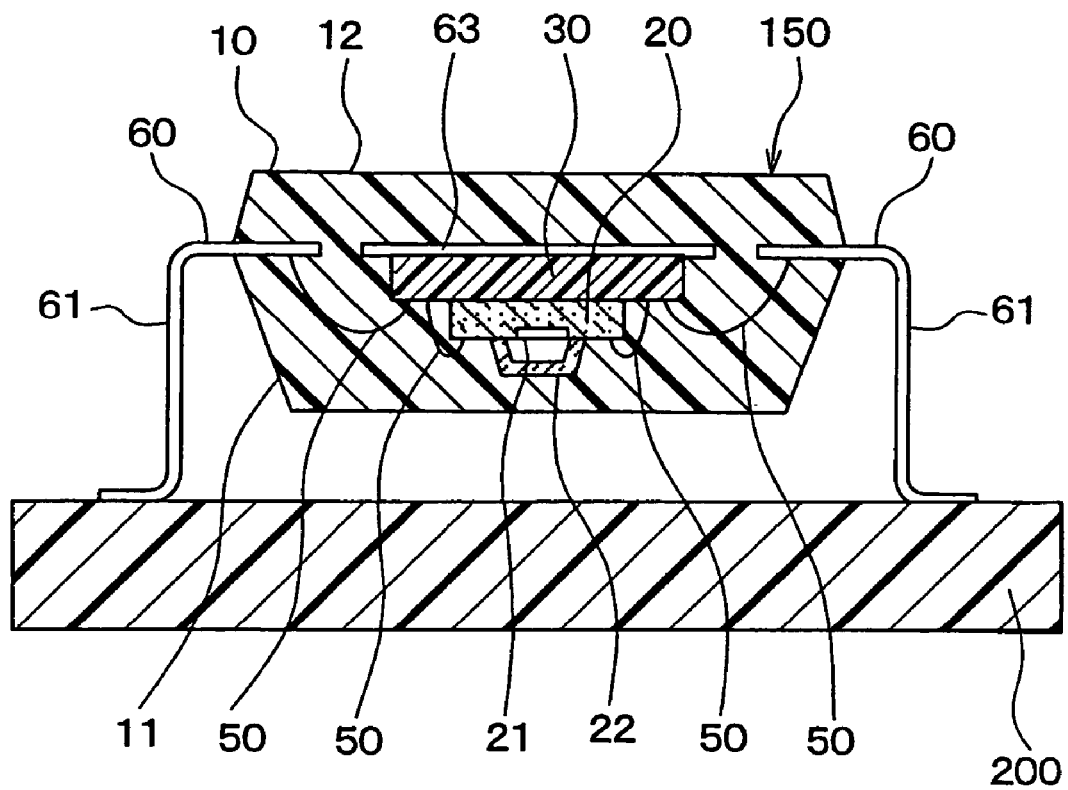
FIG. 9 is a schematic sectional view of a mount structure of mounting an angular velocity sensor according to a sixth embodiment of the present invention.

FIG. 9 is a schematic sectional view of a mount structure of mounting an angular velocity sensor 150 to the mount member 200 according to a sixth embodiment of the present invention.

Similar components of the angular velocity sensor 150 of the present embodiment similar to the components of the angular velocity sensor 100 in the first embodiment are indicated by the same numerals. In each of the above embodiments, a ceramics package serves as the package 10. However, in the present embodiment, a mold resin may be applied to serve as the package 10. In this case, the angular velocity sensor 150 of the present embodiment is manufactured similarly to a general resin-sealed semiconductor package.

Specifically, the circuit substrate 30 and the angular velocity sensing element 20 are mounted on an island 63 of the lead frame. Here, a cap 22 is mounted on the one side of the angular velocity sensing element 20 for isolating the oscillator 21 from the mold resin. The cap 22 is made of silicone or glass.

Then, the wirebonding is made, and mold resin sealing is made such that the package 10 is formed. After this, the forming step is made for the lead frames 60. Thus, the angular velocity sensor 150 of the present embodiment is completed.

Then, the angular velocity sensor 150 is fixed to the mount member 200 through lead frames 60 such that the mount structure of the present embodiment is completed. In this case, the first end segment of each lead frame 60 is buried in the package 10 and a projecting portion that projects from a side face of the package 10 is bent to form the extending segment 61. In the present mount structure, the similar advantages of the above embodiments can be achieved.

Other Embodiment

In the above embodiments, the extending segment 61 is formed by bending the part of the first end segment of the lead frame 60 toward the mount member 200, the part being close to the middle segment. The extending segment 61 is not limited to this as long as the extending segment 61 extends toward the mount member 200 in the mount direction of mounting the angular velocity sensor.

For example, in FIG. 1, in a case where the first end segment of the lead frame 60 is fixed to the side face of the package 10 between the first face 11 and the second face 12, a segment of the lead frame 60 that straightforwardly extends from the first end segment toward the mount member 200 can serve as an alternative extending segment.

Also, in the above manufacturing method, the circuit substrate 30 and the angular velocity sensing element 20 are provided in the package 10, and then, the wirebonding is made. Then, the sealing is made by the lid 14 before the lead frames 60 are connected. However, the connection timing of the lead frames 60 to the package 10 is not limited to this.

For example, firstly, the lead frames 60 as the multiple lead frame structure may be connected with multiple packages 10. Then, each component is received in the corresponding package 10. Then, the wirebonding and the sealing are made. After the wirebonding and the sealing, the lead frames 60 are cut and forming of the lead frames may be made.

Also, the connection of the lead frames 60 to the package 10 or the mount member 200 is not limited to the above soldering. However, other methods, such as brazing, may be alternatively made.

The package 10 may alternatively house only the angular velocity sensing element 20 without housing the circuit substrate 30. In this case, the connection between the angular velocity sensing element 20 and the package 10 may be made directly through the bonding wires 50.

Additional advantages and modifications will readily occur to those skilled in the art. The invention in its broader terms is therefore not limited to the specific details, representative apparatus, and illustrative examples shown and described.

What is claimed is:

1. An angular velocity mount arrangement comprising:
  an angular velocity sensor, which includes:
    an oscillator;
    an angular velocity sensing element that senses an angular velocity based on an oscillation of the oscillator in a first axis direction;
    a package that houses the angular velocity sensing element; and
    a plurality of lead frames, each of which is electrically connected to the angular velocity sensing element; and a mount member that is arranged relative to the angular velocity sensor in a second axis direction, which is generally orthogonal to the first axis direction, the angular velocity sensor being mounted to the mount member through the plurality of lead frames, wherein:

the mount member is spaced from the package of the annular velocity sensor;

each of the plurality of lead frames includes:

a first end segment that is fixed to the package;

at least one extending segment that is a middle segment of each of the plurality of lead frames and extends toward the mount member in the second axis direction; and a second end segment that is fixed to the mount member; and the at least one extending segment of each of the plurality of lead frames is able to oscillate in the first axis direction.

2. The angular velocity mount arrangement according to claim 1, wherein the at least one extending segment of each of the plurality of lead frames is formed by bending each of the plurality of lead frames at a connection between the first end segment and the middle segment of each of the plurality of lead frames such that the middle segment of each of the plurality of lead frames extends toward the mount member.

3. The angular velocity mount arrangement according to claim 2, wherein the package includes:

a first face that faces the mount member;

a second face that is opposite from the first face, the first end segment of each of the plurality of lead frames being fixed to the second face of the package; and an edge face, along which the at least one extending segment of each of the plurality of lead frames extends.

4. The angular velocity mount arrangement according to claim 1, wherein the angular velocity sensing element includes one side, on which the oscillator is provided, the one side of the angular velocity sensing element facing the mount member.

5. The angular velocity mount arrangement according to claim 1, wherein the at least one extending segment of each of the plurality of lead frames is narrower than the first end segment of each of the plurality of lead frames.

6. The angular velocity mount arrangement according to claim 1, wherein:

the at least one extending segment of each of the plurality of lead frames includes a first extending segment and a second extending segment of each of the plurality of lead frames;

each of the plurality of lead frames includes a bent shape that is located between the first end segment and the first extending segment, the bent shape including the second extending segment, which extends in the second axis direction; and the second extending segment of each of the plurality of lead frames is able to oscillate in the first axis direction.

7. The angular velocity mount arrangement according to claim 1, wherein each of the plurality of lead frames includes a viscous member attached to a segment between the first and second end segments of each of the plurality of lead frames.

8. The angular velocity mount arrangement according to claim 7, wherein the viscous member is made of a resilient resin.

9. The angular velocity mount arrangement according to claim 8, wherein the viscous member includes a sheet-shaped silicone rubber.

10. The angular velocity mount arrangement according to claim 1, wherein each of the plurality of lead frames is brazed to the package by use of a silver filler material.

11. The angular velocity mount arrangement according to claim 1, wherein each of the plurality of lead frames is brazed to the package by use of a high-temperature solder.

12. The angular velocity mount arrangement according to claim 1, wherein the at least one extending segment of each of the plurality of lead frames is able to oscillate in the first axis direction due to a resilient characteristic of the at least one extending segment.

13. The angular velocity mount arrangement according to claim 3, wherein the second face of the package is provided generally perpendicular to the second axis direction.

14. The angular velocity mount arrangement according to claim 1, wherein the angular velocity sensor is mounted to the mount member only through the plurality of lead frames.

* * * * *